United States Patent
Hsieh et al.

(10) Patent No.: US 9,961,759 B2
(45) Date of Patent: May 1, 2018

(54) FLEXIBLE SUBSTRATE

(71) Applicant: CHIPBOND TECHNOLOGY CORPORATION, Hsinchu (TW)

(72) Inventors: Chin-Tang Hsieh, Kaohsiung (TW); Fei-Jain Wu, Hsinchu County (TW); Chia-Jung Tu, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days. days.

(21) Appl. No.: 15/279,657

(22) Filed: Sep. 29, 2016

(65) Prior Publication Data
US 2017/0019984 A1    Jan. 19, 2017

Related U.S. Application Data

(63) Continuation of application No. 14/642,945, filed on Mar. 10, 2015, now Pat. No. 9,510,441.

(30) Foreign Application Priority Data

Feb. 5, 2015    (TW) .............................. 104103978 A

(51) Int. Cl.
*H05K 1/11*    (2006.01)
*H05K 1/02*    (2006.01)
(Continued)

(52) U.S. Cl.
CPC ......... *H05K 1/0209* (2013.01); *H05K 1/0203* (2013.01); *H05K 1/028* (2013.01);
(Continued)

(58) Field of Classification Search
CPC .. H05K 1/00; H05K 1/02; H05K 1/09; H05K 1/14; H05K 1/16; H05K 1/18;
(Continued)

(56) References Cited

U.S. PATENT DOCUMENTS 5,306,670 A    4/1994    Mowatt
5,432,677 A    7/1995    Mowatt
(Continued)

FOREIGN PATENT DOCUMENTS

CN    101365300 A    2/2009
CN    12290381 A    12/2011
(Continued)

OTHER PUBLICATIONS

Taiwanese Office Action dated Dec. 20, 2016 for Taiwanese Patent Application No. 104103978, 12 pages.
(Continued)

*Primary Examiner* — Xiaoliang Chen
(74) *Attorney, Agent, or Firm* — Jackson IPG PLLC; Demian K. Jackson

(57) ABSTRACT

A flexible substrate includes a circuit board, a flexible heat-dissipating structure and an adhesive. The circuit board has a substrate and a circuit layer formed on a top surface of the substrate, and the flexible heat-dissipating structure has a flexible supporting plate and a flexible heat-dissipating metal layer formed on a surface of the flexible supporting plate. The flexible heat-dissipating metal layer of the flexible heat-dissipating structure is connected with a bottom surface of the substrate by the adhesive. The circuit layer and the flexible heat-dissipating metal layer are made of same material.

13 Claims, 4 Drawing Sheets

(51) Int. Cl.
*H05K 1/03* (2006.01)
*H05K 1/18* (2006.01)

(52) U.S. Cl.
CPC ......... *H05K 1/0346* (2013.01); *H05K 1/0393* (2013.01); *H05K 1/189* (2013.01); *H05K 2201/0154* (2013.01); *H05K 2201/066* (2013.01); *H05K 2201/068* (2013.01)

(58) Field of Classification Search
CPC . H05K 1/111; H05K 3/00; H05K 3/40; H05K 3/46; H05K 7/20; H01L 23/52; H01L 23/498
USPC ......... 174/252, 254, 257–261, 264; 361/709, 361/719, 720, 749, 769; 257/724, 734, 257/784
See application file for complete search history.

(56) References Cited

U.S. PATENT DOCUMENTS

| | | | | |
|---|---|---|---|---|
| 5,616,888 | A * | 4/1997 | McLaughlin | H05K 1/183 174/252 |
| 5,719,749 | A * | 2/1998 | Stopperan | H05K 1/141 174/254 |
| 6,074,567 | A | 6/2000 | Kuraishi | |
| 6,175,084 | B1 | 1/2001 | Saitoh | |
| 6,400,573 | B1 * | 6/2002 | Mowatt | H01L 23/5383 174/252 |
| 6,693,029 | B2 | 2/2004 | Iijima | |
| 6,764,748 | B1 | 7/2004 | Farquhar | |
| 8,704,359 | B2 | 4/2014 | Tuominen | |
| 2004/0195686 | A1 * | 10/2004 | Jobetto | H01L 21/568 257/734 |
| 2005/0016765 | A1 * | 1/2005 | Higuchi | H05K 3/4069 174/258 |
| 2010/0244281 | A1 * | 9/2010 | Hayashi | H01L 23/49572 257/784 |
| 2011/0226513 | A1 * | 9/2011 | Chuma | H01L 23/49816 174/254 |
| 2011/0304991 | A1 * | 12/2011 | Huang | B82Y 10/00 361/719 |
| 2012/0241205 | A1 * | 9/2012 | Shimizu | H05K 1/188 174/260 |
| 2013/0092421 | A1 * | 4/2013 | Kajiya | H05K 1/0206 174/252 |
| 2014/0168899 | A1 * | 6/2014 | Chang | H05K 1/0204 361/709 |

FOREIGN PATENT DOCUMENTS

| | | |
|---|---|---|
| CN | 204408746 U | 6/2015 |
| JP | 5-152353 | 6/1993 |
| JP | 10-209345 A | 8/1998 |
| JP | 2004-079855 A | 3/2004 |
| JP | 2006-179827 | 7/2006 |
| JP | 2007-287950 A | 11/2007 |
| JP | 2009-166252 A | 7/2009 |
| JP | 2011-211190 A | 10/2011 |
| JP | 2013-4775 A | 1/2013 |
| KR | 10-2014-0123826 A | 10/2014 |
| TW | 200908823 | 2/2009 |
| TW | M501711 | 5/2015 |

OTHER PUBLICATIONS

Japanese Office Action dated Jan. 7, 2016 for Japanese Patent Application No. 2015-040221, 6 pages.
Korean Office Action dated Aug. 17, 2016 for Korean Patent Application No. 10-2015-0029616, 8 pages.
Japanese Office Action dated Sep. 6, 2016 for Japanese Patent Application No. 2015-040221, 3 pages.
Chinese Office Action dated Feb. 13, 2018 for Chinese Patent Application No. 201510078592.3, 10 pages.

* cited by examiner

US 9,961,759 B2

FLEXIBLE SUBSTRATE

CROSS REFERENCE TO RELATED APPLICATIONS

This application is a continuation application of U.S. Ser. No. 14/642,945, filed on Mar. 10, 2015, which claims priority under 35 U.S.C. § 119(a) to Patent Application No(s). 104103978, filed in Taiwan, Republic of China on Feb. 5, 2015, the entire contents of which are hereby incorporated by reference.

FIELD OF THE INVENTION

The present invention relates generally to a flexible substrate, and particularly, to a flexible substrate with flexible heat-dissipating structure.

BACKGROUND OF THE INVENTION

Modern electronic products develop gradually toward light, thin, tiny and high performance to make the heat power of the electronic products rising gradually. Conventional flexible substrate is made of low thermal-conductive material so that the operation temperature of electronic products can not reduce quickly therefore affecting the stability of the electronic products.

SUMMARY

The primary object of the present invention is to provide a flexible substrate. The heat-conductive efficiency of the flexible substrate is enhanced by a flexible heat-dissipating structure adhered to a circuit board to make the flexible substrate with heat-dissipation function and high stability.

A flexible substrate of the present invention comprises a circuit board, a flexible heat-dissipating structure and an adhesive. The circuit board comprises a substrate and a circuit layer, wherein the substrate comprises a top surface and a bottom surface, the circuit layer is formed on the top surface, and the top surface comprises a chip-disposing area. The flexible heat-dissipating structure is connected with the bottom surface of the substrate and comprises a flexible supporting plate and a flexible heat-dissipating metal layer. The flexible supporting plate comprises a surface facing toward the bottom surface of the substrate, and the flexible heat-dissipating metal layer is formed on the surface of the flexible supporting plate. The flexible heat-dissipating metal layer is located underneath the chip-disposing area and comprises a nickel-chromium alloy layer formed on the surface, a first copper layer formed on the nickel-chromium alloy layer and a second copper layer formed on the first copper layer. The flexible heat-dissipating metal layer and the circuit layer are made of same material. The adhesive is formed on the second copper layer and the second copper layer is connected with the bottom surface of the substrate by the adhesive.

DETAILED DESCRIPTION OF THE INVENTION

With reference to FIGS. 1 and 2A to 2E, a manufacturing method of a flexible substrate in accordance with a first embodiment includes step 11 of providing a circuit board, step 12 of providing a flexible heat-dissipating structure, step 13 of performing a cutting procedure, step 14 of providing an adhesive and step 15 of performing a sticking procedure.

Figure 1:
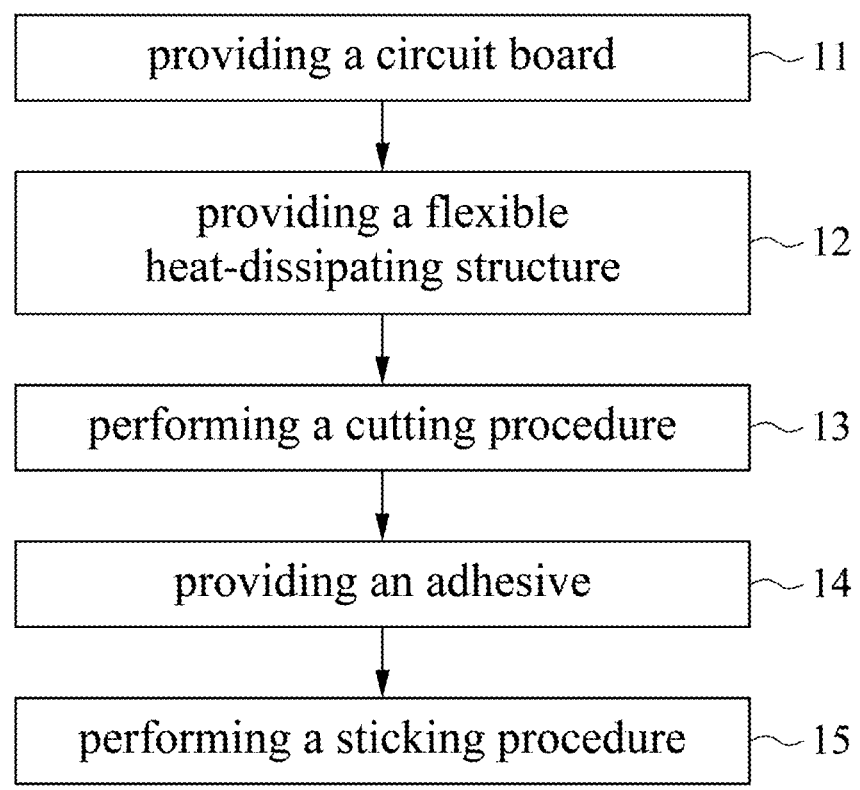
FIG. 1 is a manufacturing flow illustrating a flexible substrate in accordance with an embodiment of the present invention.
Figure 2A:
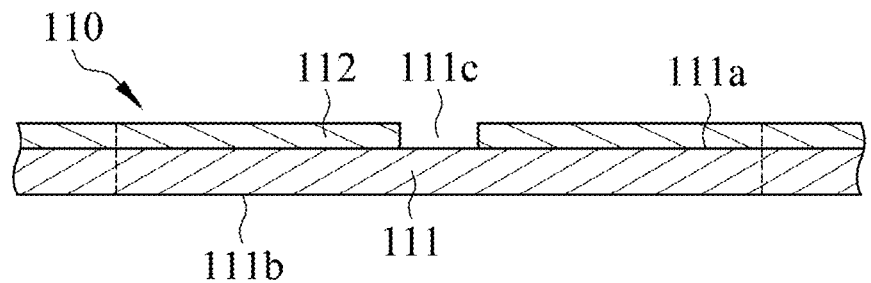
FIG. 2A is a side-view diagram illustrating a circuit board in accordance with the embodiment of the present invention.

With reference to FIGS. 1 and 2A, providing a circuit board 110 in step 11, the circuit board 110 comprises a substrate 111 and a circuit layer 112 wherein the substrate 111 comprises a top surface 111a and a bottom surface 111b, the circuit layer 112 is formed on the top surface 111a, and the top surface 111a comprises a chip-disposing area 111c.

Figure 2B:
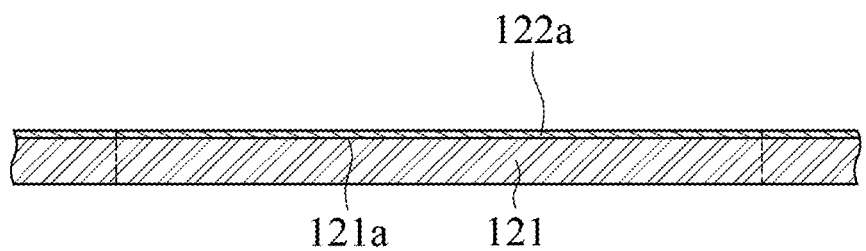
FIG. 2B to 2E are manufacturing diagrams illustrating a flexible heat-dissipating structure in accordance with a first embodiment of the present invention.
Figure 2C:
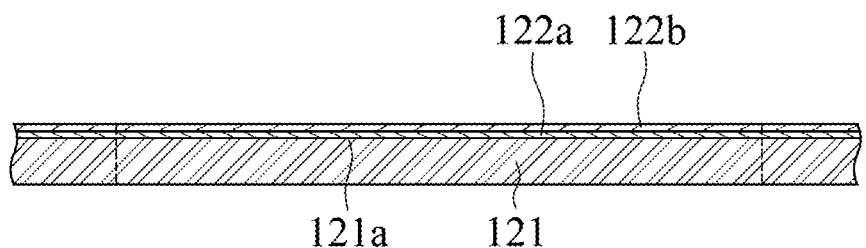
Figure 2D:
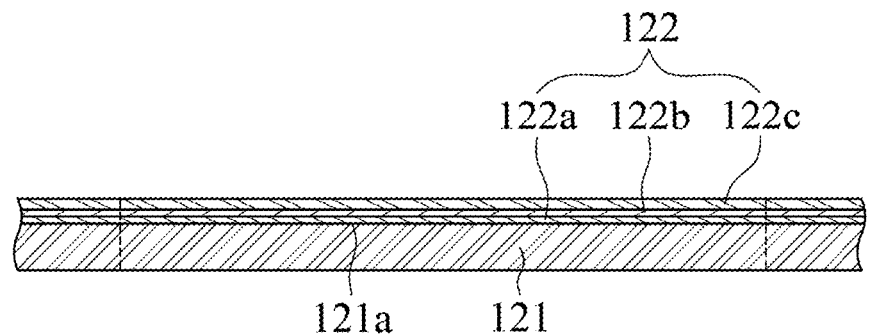
Figure 2E:
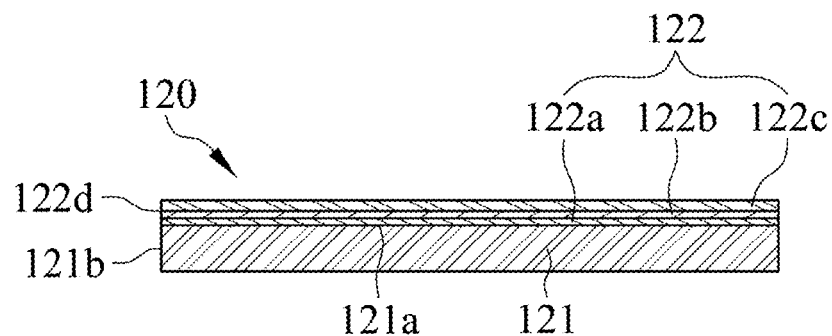

With reference to FIGS. 1, 2D and 2E, providing a flexible heat-dissipating structure 120 in step 12, the flexible heat-dissipating structure 120 comprises a flexible supporting plate 121 and a flexible heat-dissipating metal layer 122, wherein the flexible supporting plate 121 comprises a surface 121a, and the flexible heat-dissipating metal layer 122 is formed on the surface 121a of the flexible supporting plate 121. The material of the flexible supporting plate 121 is selected from polyimide (PI) or polyamic acid (PAA). In this embodiment, the material of the flexible supporting plate 121 is polyimide (PI). Preferably, the flexible supporting plate 121 and the substrate 111 are made of same material, and the flexible heat-dissipating metal layer 122 and the circuit layer 112 are made of same material.

With reference to FIGS. 2B to 2D, the flexible heat-dissipating metal layer 122 comprises a nickel-chromium alloy layer 122a, a first copper layer 122b and a second copper layer 122c. In this embodiment, the nickel-chromium alloy layer 122a is formed on the surface 121a of the flexible supporting plate 121 by sputtering, next, the first copper layer 122b is formed on the nickel-chromium alloy layer 122a by sputtering, and the second copper layer 122c is formed on the first copper layer 122b by electro-plating therefore forming the flexible heat-dissipating metal layer 122.

With reference to FIGS. 1, 2D and 2E, in step 13, the flexible heat-dissipating structure 120 is cut by cutting tool (not shown in Fig.), preferably, the area of the flexible heat-dissipating structure 120 is not larger than the area of the circuit board 110. In this embodiment, the flexible heat-dissipating metal layer 122 after cutting comprises a lateral surface 122d, and the flexible supporting plate 121 after cutting comprises a side wall 121b coplanar with the lateral surface 122d.

Figure 2F:
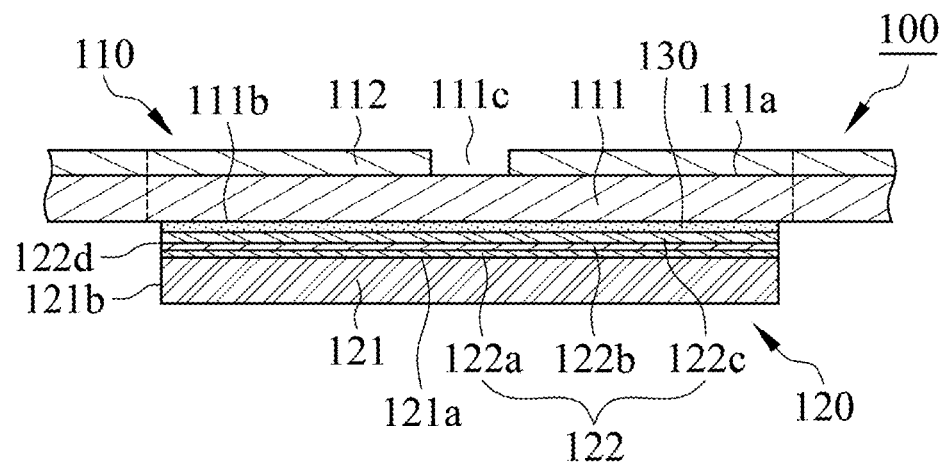
FIG. 2F is a side-view diagram illustrating the flexible substrate in accordance with the first embodiment of the present invention.

With reference to FIGS. 1 and 2F, providing an adhesive 130 in step 14, the adhesive 130 is formed on the second copper layer 122c of the flexible heat-dissipating metal layer 122. In this embodiment, the material of the adhesive 130 is 3M™ Adhesive Transfer Tape 467MP.

With reference to FIGS. 1 and 2F, in step 15, the flexible heat-dissipating structure 120 is connected with the bottom surface 111b of the substrate 111, and the surface 121a of the flexible supporting plate 121 faces toward the bottom surface 111b of the substrate 111. The second copper layer 122c of the flexible heat-dissipating metal layer 122 is connected with the bottom surface 111b of the substrate 111 by the adhesive 130 and the flexible heat-dissipating metal layer 122 is located underneath the chip-disposing area 111c. The flexible heat-dissipating metal layer 122 with high heat-conducting efficiency is able to enhance the heat-conducting efficiency of the circuit board 110 and a chip (not shown in Fig.) disposed on the chi-disposing area 111c.

A flexible substrate 100 is formed by step 11 to 15 in the manufacturing method. The flexible substrate 100 comprises the circuit board 110, the flexible heat-dissipating structure 120 and the adhesive 130. The flexible heat-dissipating structure 120 is connected with the substrate 111 of the circuit board 110 by the adhesive 130 formed on the second copper layer 122c. As a result of the substrate 111 of the circuit board 110 and the flexible supporting plate 121 of the flexible heat-dissipating structure 120 are made of same material, and the circuit layer 112 of the circuit board 110 and the flexible heat-dissipating metal layer 122 of the flexible heat-dissipating structure 120 are made of same material, so the thermal expansion coefficient of the circuit board 110 and the flexible heat-dissipating structure 120 are similar. For the reason, the warping of the flexible substrate 100 due to the difference thermal expansion level between the circuit board 110 and the flexible heat-dissipating structure 120 is avoidable.

Figure 3:
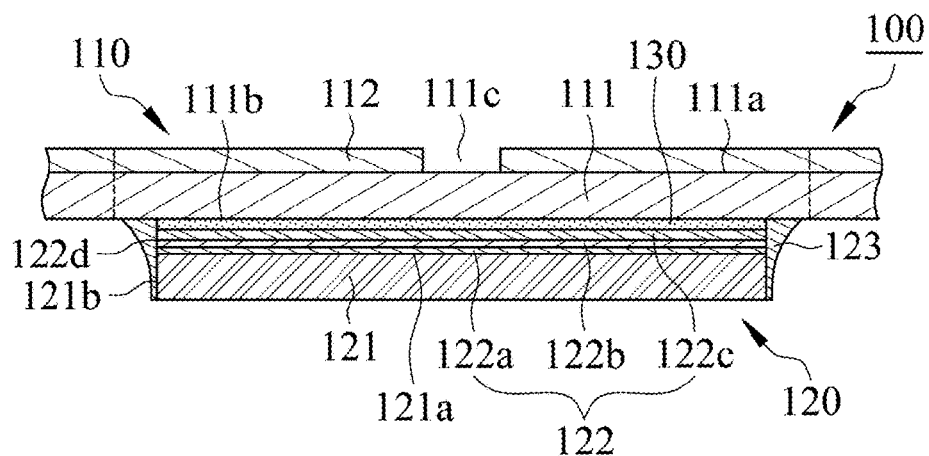
FIG. 3 is a side-view diagram illustrating the flexible substrate in accordance with a second embodiment of the present invention.

A second embodiment of the present invention is illustrated in FIG. 3. The primary difference between the second and the first embodiment is that the flexible heat-dissipating structure 120 further comprises a protecting layer 123 in the second embodiment. The protecting layer 123 covers the lateral surface 122d of the flexible heat-dissipating metal layer 122 and the bottom surface 111b of the substrate 111. The protecting layer 123 is used to prevent metal ionization of the lateral surface 122d of the flexible heat-dissipating metal layer 122 from occurring. Preferably, the protecting layer 123 also covers the side wall 121b of the flexible supporting plate 121 to prevent the flexible supporting plate 121 from departing from the flexible heat-dissipating metal layer 122 and enhance the connecting strength between the flexible heat-dissipating structure 120 and the circuit board 110.

Figure 4A:
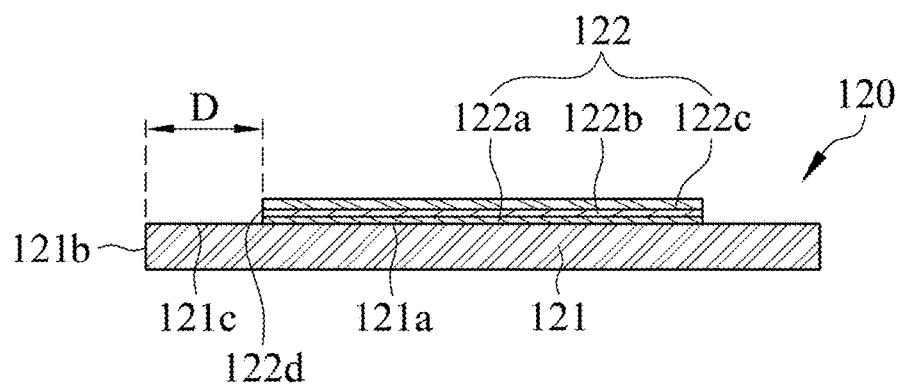
FIG. 4A is a side-view diagram illustrating the flexible heat-dissipating structure in accordance with a third embodiment of the present invention.
Figure 4B:
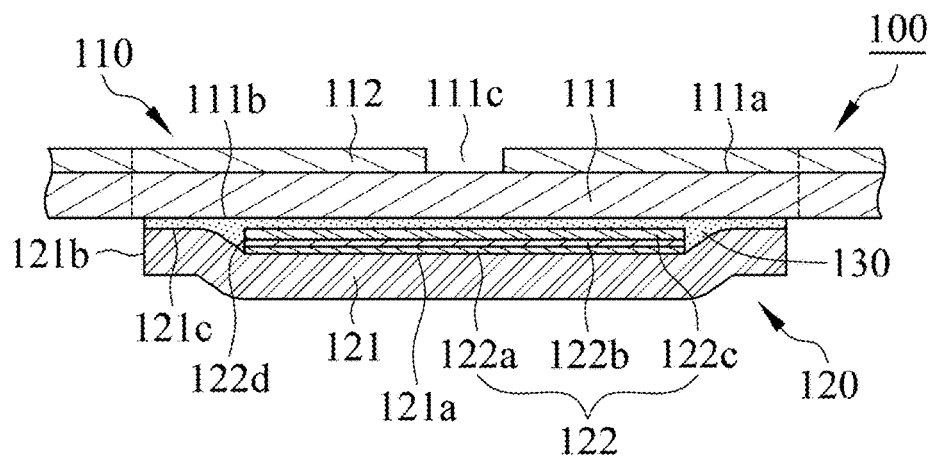
FIG. 4B is a side-view diagram illustrating the flexible substrate in accordance with the third embodiment of the present invention.

A third embodiment of the present invention is illustrated in FIGS. 4A and 4B. The primary difference between the third and the first embodiment is that there is a space D between the lateral surface 122d of the flexible heat-dissipating metal layer 122 and the side wall 121b of the flexible supporting plate 121 in the third embodiment. The space D makes the surface 121a of the flexible supporting plate 121 has an exposing surface 121c not covered by the flexible heat-dissipating metal layer 122. The adhesive 130 covers the second copper layer 122c of the flexible heat-dissipating metal layer 122 and the exposing surface 121c. When the flexible heat-dissipating structure 120 is connected with the bottom surface 111b of the substrate 111, the second copper layer 122c and the exposing surface 121c are connected with the bottom surface 111b of the substrate 111 by the adhesive 130 to make the flexible heat-dissipating metal layer 122 being sealed between the flexible supporting plate 121 and the substrate 111 thus preventing metal ionization of the lateral surface 122d of the flexible heat-dissipating metal layer 122 from occurring and preventing the flexible heat-dissipating structure 120 from departing from the circuit board 110.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A flexible substrate comprising:
   a circuit board including a substrate and a circuit layer, wherein the substrate has a top surface and a bottom surface, the circuit layer is formed on the top surface, and the top surface has a chip-disposing area;
   a flexible heat-dissipating structure connected with the bottom surface of the substrate and including a flexible supporting plate and a flexible heat-dissipating metal layer, wherein the flexible supporting plate has a surface facing toward the bottom surface of the substrate, the flexible heat-dissipating metal layer is formed on the surface of the flexible supporting plate, located underneath the chip-disposing area and not electrically connected to the circuit layer, wherein the substrate and the flexible supporting plate are made of same material and the flexible heat-dissipating metal layer includes a nickel-chromium alloy layer formed on the surface, a first copper layer formed on the nickel-chromium alloy layer and a second copper layer formed on the first copper layer; and
   an adhesive formed on the flexible heat-dissipating metal layer, wherein the flexible heat-dissipating metal layer is directly connected with the bottom surface of the substrate by the adhesive.

2. The flexible substrate in accordance with claim 1, wherein the flexible heat-dissipating metal layer has a lateral surface, and the flexible supporting plate has a side wall coplanar with the lateral surface.

3. The flexible substrate in accordance with claim 2, wherein the flexible heat-dissipating structure further includes a protecting layer covering the lateral surface of the flexible heat-dissipating metal layer and the bottom surface of the substrate.

4. The flexible substrate in accordance with claim 3, wherein the protecting layer covers the side wall of the flexible supporting plate.

5. The flexible substrate in accordance with claim 1, wherein the flexible heat-dissipating metal layer has a lateral surface, the flexible supporting plate has a side wall, and a space between the lateral surface and the side wall makes the surface of the flexible supporting plate has an exposing surface not covered by the flexible heat-dissipating metal layer.

6. The flexible substrate in accordance with claim 5, wherein the adhesive covers the exposing surface, and the exposing surface is connected with the bottom surface of the substrate by the adhesive.

7. The flexible substrate in accordance with claim 1, wherein the material of the flexible supporting plate is selected from polyimide or polyamic acid.

8. The flexible substrate in accordance with claim 1, wherein the adhesive is formed on the second copper layer.

9. The flexible substrate in accordance with claim 1, wherein the circuit layer and the flexible heat-dissipating metal layer are made of same material.

10. A flexible substrate comprising:
- a circuit board including a substrate and a circuit layer, wherein the substrate has a top surface and a bottom surface, the circuit layer is formed on the top surface, and the top surface has a chip-disposing area;
- a flexible heat-dissipating structure connected with the bottom surface of the substrate and including a flexible supporting plate and a flexible heat-dissipating metal layer, wherein the flexible supporting plate has a surface facing toward the bottom surface of the substrate and a side wall, the flexible heat-dissipating metal layer has a lateral surface and is formed on the surface of the flexible supporting plate, located underneath the chip-disposing area and not electrically connected to the circuit layer, wherein the substrate and the flexible supporting plate are made of same material and a space between the lateral surface and the side wall makes the surface of the flexible supporting plate has an exposing surface not covered by the flexible heat-dissipating metal layer; and
- an adhesive formed on the flexible heat-dissipating metal layer and covering the exposing surface of the flexible supporting plate, wherein the flexible heat-dissipating metal layer and the exposing surface are directly connected with the bottom surface of the substrate by the adhesive.

11. The flexible substrate in accordance with claim 10, wherein the material of the flexible supporting plate is selected from polyimide or polyamic acid.

12. The flexible substrate in accordance with claim 10, wherein the flexible heat-dissipating metal layer includes a nickel-chromium alloy layer formed on the surface, a first copper layer formed on the nickel-chromium alloy layer and a second copper layer formed on the first copper layer, and the adhesive is formed on the second copper layer.

13. The flexible substrate in accordance with claim 10, wherein the circuit layer and the flexible heat-dissipating metal layer are made of same material.

* * * * *